(12) United States Patent
Park et al.

(10) Patent No.: US 7,943,932 B2
(45) Date of Patent: May 17, 2011

(54) DISPLAY SUBSTRATE, DISPLAY DEVICE AND METHOD OF MANUFACTURING THE SAME

(75) Inventors: Yong In Park, Anyang-si (KR); Seung Han Paek, Incheon (KR); Sang Soo Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 510 days.

(21) Appl. No.: 11/979,459

(22) Filed: Nov. 2, 2007

(65) Prior Publication Data

US 2008/0185588 A1 Aug. 7, 2008

(30) Foreign Application Priority Data

Feb. 5, 2007 (KR) .................. 10-2007-0011566

(51) Int. Cl.
H01L 29/04 (2006.01)
(52) U.S. Cl. ............... 257/59; 257/E29.003; 257/E21.7; 257/E21.002; 257/252; 257/254; 257/257; 257/258; 438/30; 438/151; 438/22; 438/24; 438/48
(58) Field of Classification Search .............. 257/59, 257/E29.003, E21.7, 252, 254, 257, 258, 257/253, E33.059, E33.001, E33.008; 438/151, 438/30
See application file for complete search history.

(56) References Cited

U.S. PATENT DOCUMENTS

| | | | |
|---|---|---|---|
| 2002/0036616 A1* | 3/2002 | Inoue ........................ | 345/107 |
| 2006/0148141 A1* | 7/2006 | Seo et al. .................... | 438/151 |
| 2007/0103613 A1* | 5/2007 | Song et al. .................. | 349/43 |
| 2007/0159335 A1* | 7/2007 | Arai et al. ................... | 340/572.8 |

OTHER PUBLICATIONS

A. Henzen et al., "Development of Active Matrix Electronic Ink Displays for Handheld Devices", SID 03 Digest, pp. 176-179.
R. Zehner et al., "Drive Waveforms for Active Matrix Electrophoretic Displays", SID 03 Digest, pp. 842-845.
M. Pitt, "Power Consumption of Micro-encapsulated Electrophoretic Displays for Smart Handheld Applications", SID 02 Digest, pp. 1387-1381.
D. Duthaler et al., "Active-Matrix Color Displays Using Electrophoretic Ink and Color Filters", SID 02 Digest, pp. 1374-1377.
R. Webber, "Image Stability in Active-Matrix Microencapsulated Electrophoretic Displays", SID 02 Digest, pp. 126-129.
K. Amundson er al., "Flexible, Active-Matrix Display Constructed Using a Microencapsulated Electrophoretic Material and an Organic-Semiconductor-Based Backplane", SID 01 Digest, pp. 160-163. Y. Chen et al., "A Conformable Electronic Ink Display Using a foil-Based a-Si TFT Array", SID 01 Digest, pp. 157-159.
P. Kazlas et al., "SVGA Microencapsulation Electropherotic Active Matrix Display for Information Appliances", SID 01 Digest, pp. 152-155.

* cited by examiner

*Primary Examiner* — Wael M Fahmy
*Assistant Examiner* — Marc Armand
(74) *Attorney, Agent, or Firm* — McKenna Long & Aldridge LLP

(57) ABSTRACT

A flexible display substrate includes: a thin film transistor on the flexible substrate, the thin film transistor including a gate electrode, a gate insulating layer insulating the gate electrode, a channel layer on the gate insulating layer, a source electrode connected with the channel layer, and a drain electrode connected with the channel layer; a first stress absorbing layer below the thin film transistor; a first protection layer on the first stress absorbing layer; a second stress absorbing layer on the thin film transistor; a second protection layer on the second stress absorbing layer; and a pixel electrode on the second protection layer, the pixel electrode being connected with the drain electrode.

14 Claims, 8 Drawing Sheets

DISPLAY SUBSTRATE, DISPLAY DEVICE AND METHOD OF MANUFACTURING THE SAME

This application claims the benefit of Korean Patent Application No. 10-2007-0011566, filed on Feb. 05, 2007, which is hereby incorporated by reference for all purposes as if fully set forth herein.

BACKGROUND OF THE INVENTION

1. Field of the Invention

The present disclosure relates to a display substrate, display device and a method of manufacturing the same, and more particularly, to a display substrate that may prevent cracking and damage to a driving device and a pixel electrode caused by warping of a substrate, and a method of manufacturing the same.

2. Discussion of the Related Art

Recently, information processing devices for processing a large amount of data and display devices for displaying data processed by the information processing devices are under development. In addition, flexible display devices that can be folded or bent are under development.

To realize a flexible display device that may be folded or bent, a substrate on which driving devices and pixels displaying an image are disposed may be folded or bent. For this reason, flexible display devices primarily include a very thin substrate or a flexible synthetic resin substrate.

However, when a substrate of a flexible display substrate is bent or folded, excessive stress is applied to the devices or pixels disposed on the substrate. Particularly, the driving devices such as thin film transistors (TFTs) or pixels that include a solid inorganic layer, damage to the driving devices or pixels may be generated due to excessive stress.

SUMMARY OF THE INVENTION

Accordingly, the present invention is directed to a display device and method of manufacturing the same that substantially obviates one or more of the problems due to limitations and disadvantages of the related art.

An advantage of the present invention is to prevent damage of driving devices or pixels disposed on a flexible substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible display substrate includes: a thin film transistor on the flexible substrate, the thin film transistor including a gate electrode, a gate insulating layer insulating the gate electrode, a channel layer on the gate insulating layer, a source electrode connected with the channel layer, and a drain electrode connected with the channel layer; a first stress absorbing layer below the thin film transistor; a first protection layer on the first stress absorbing layer; a second stress absorbing layer on the thin film transistor; a second protection layer on the second stress absorbing layer; and a pixel electrode on the second protection layer, the pixel electrode being connected with the drain electrode.

In another aspect of the present invention, a method of manufacturing a flexible display substrate includes: forming a first stress absorbing layer on the flexible substrate; forming a first protection layer on the first stress absorbing layer; forming a thin film transistor on the first protection layer, the thin film transistor including a gate electrode, a gate insulating layer insulating the gate electrode, a channel layer on the gate insulating layer, a source electrode connected with the channel layer, and a drain electrode connected with the channel layer; forming a second stress absorbing layer on the thin film transistor; forming a second protection layer on the second stress absorbing layer; and forming a pixel electrode on the second protection layer, the pixel electrode being connected with the drain electrode.

In yet another aspect of the present invention, a method of manufacturing an electrophoretic ink flexible display device includes: forming a first stress absorbing layer on a flexible substrate; forming a first protection layer on the first stress absorbing layer; forming a thin film transistor on the first protection layer, the thin film transistor including a gate electrode, a gate insulating layer insulating the gate electrode, a channel layer on the gate insulating layer, a source electrode connected with the channel layer, and a drain electrode connected with the channel layer; forming a second stress absorbing layer on the thin film transistor; forming a second protection layer on the second stress absorbing layer; forming a pixel electrode on the second protection layer, the pixel electrode being connected with the drain electrode; and forming an electrophoretic ink film on the flexible substrate.

In yet another aspect of the present invention, a method of manufacturing a flexible liquid crystal display device includes: forming a first stress absorbing layer on a first flexible substrate; forming a first protection layer on the first stress absorbing layer; forming a thin film transistor on the first protection layer, the thin film transistor including a gate electrode, a gate insulating layer insulating the gate electrode, a channel layer on the gate insulating layer, a source electrode connected with the channel layer, and a drain electrode connected with the channel layer; forming a second stress absorbing layer on the thin film transistor; forming a second protection layer on the second stress absorbing layer; forming a pixel electrode on the second protection layer, the pixel electrode being connected with the drain electrode; forming a second flexible substrate; and forming a liquid crystal layer between,the first and second flexible substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Figure 1:
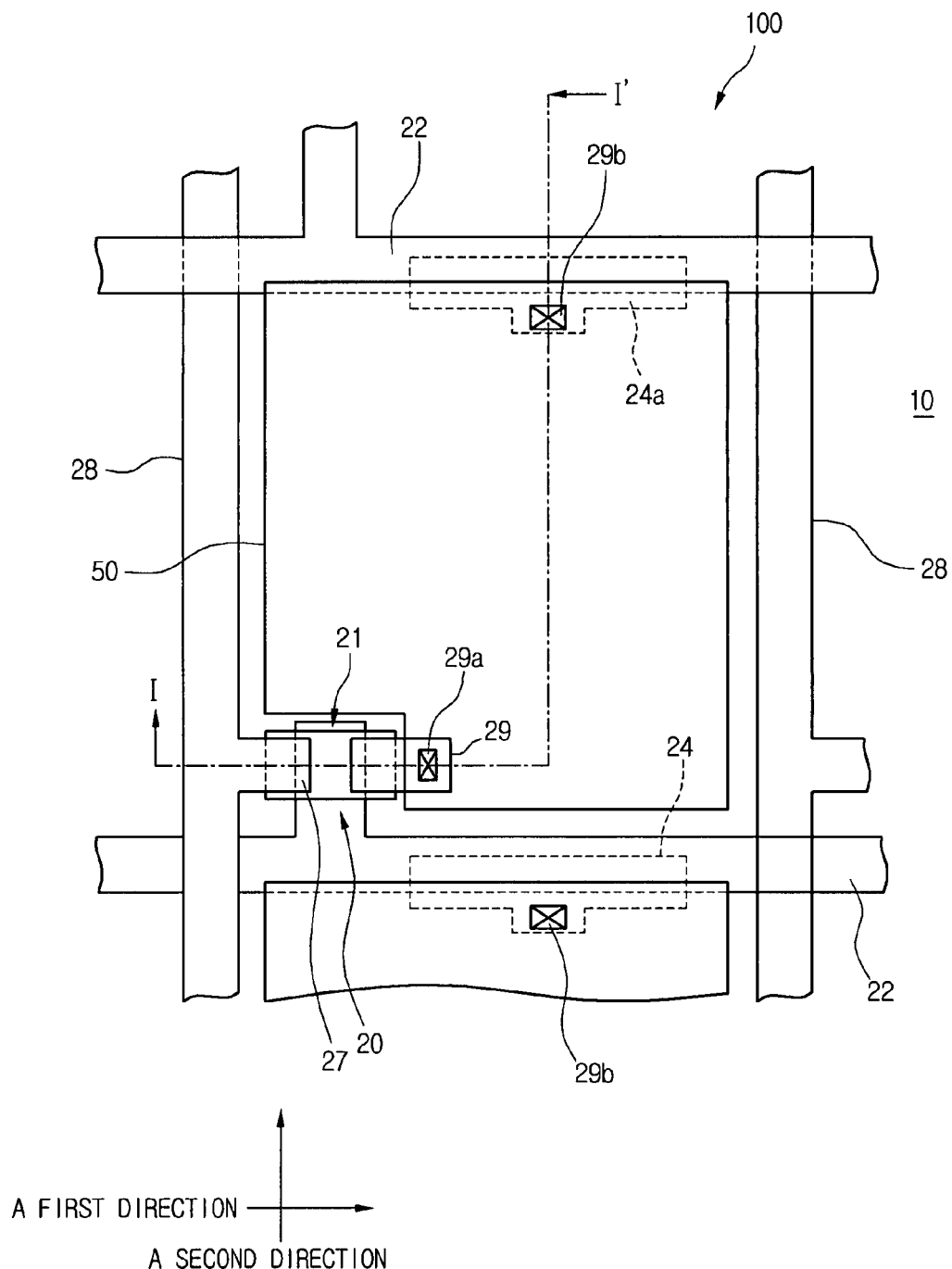
FIG. 1 is a plan view of a display substrate according to an embodiment.

Reference will now be made in detail to an embodiment of the present invention, example of which is illustrated in the accompanying drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Hereinafter, a display device and a method of manufacturing the same will be described in detail according to embodiments thereof with reference to the accompanying drawings, but the present disclosure is not limited to the embodiments, those of ordinary skill in the art would realize the present disclosure in various other forms without departing from the scope and sprit of the present disclosure. In the drawings, the dimensions of a substrate, a thin film transistor, a first stress absorbing layer, a second stress absorbing layer, a pixel, and other structures are exaggerated for clarity. In the present disclosure, it will be understood that when a substrate, a thin film transistor, a first stress absorbing layer, a second stress absorbing layer, a pixel, and other structures are referred to as being 'on', 'above', or 'below', they may be directly 'on', 'above', or 'below' another substrate, another thin film transistor, another first stress absorbing layer, another second stress absorbing layer, another pixel, and the other structures, or other intervening structures may also be present. Also, it will be understood that when elements of the present disclosure are referred to as 'a first', 'a second', and 'a third' for example, the references are not intended to limit the elements but discriminate them. Therefore, the references of 'a first', 'a second', and 'a third' may be selectively or exchangeably used.

Figure 2:
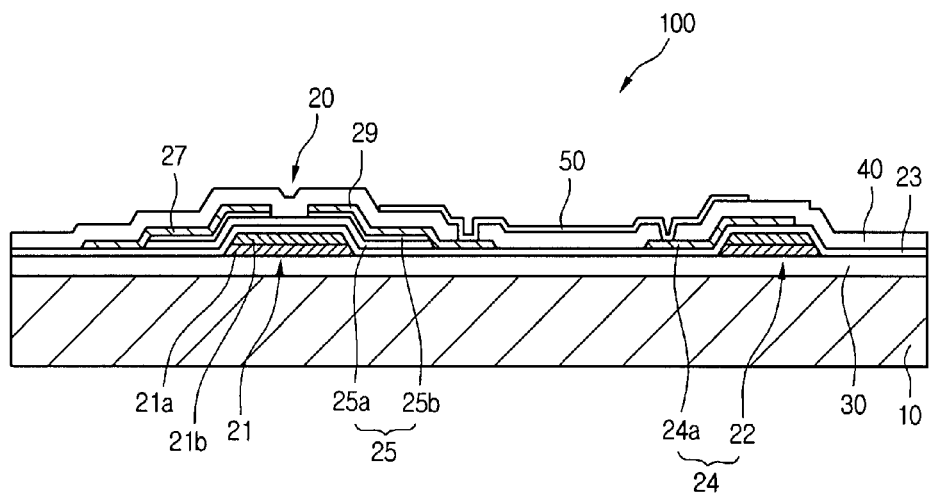
FIG. 2 is a cross-sectional view taken along the line I-I' of FIG. 1.

FIG. 1 is a plan view of a display substrate according to embodiments. FIG. 2 is a cross-sectional view taken along the line I-I' of FIG. 1.

Referring to FIGS. 1 and 2, the display substrate 100 includes a substrate 10, a thin film transistor (TFT) 20, a first stress absorbing layer 30, a second absorbing layer 40, and a pixel electrode 50.

The substrate 10 may include a flexible substrate. The substrate 10 may be transparent. The substrate may be flexible synthetic resin. Examples of a material that may be used for the substrate 10 include polycarbonate (PC), polyimide (PI), polyethersulphone (PES), polyacrylate (PAR), polyethylenenaphthelate (PEN), and polyethyleneterephehalate (PET). Alternatively, the substrate 10 may be a foil having a very thin thickness.

The TFT 20 may include a gate electrode 21, a gate insulating layer 23, a channel layer 25, a source electrode 27, and a drain electrode 29.

The gate electrode 21 extends along the substrate 10 from a gate line 22. In an embodiment, the gate electrode 21 extends in a direction substantially perpendicular to the gate line 22. In an embodiment, the gate line 22 including the gate electrode 21 is formed of an Al—Nd alloy pattern 21a and a Mo pattern 21b on the Al—Nd alloy pattern 21a.

The gate insulating layer 23 is on the substrate 10 and covers the gate line 22 including the gate electrode 21. In an embodiment, the gate insulating layer 23 may be an inorganic layer such as a $SiN_x$ layer.

The channel layer 25 is on the gate insulating layer 23. In an embodiment, the channel layer 25 may include an amorphous silicon pattern 25a and n⁺ amorphous silicon patterns 25b into which high concentration impurities have been implanted. Two n⁺ amorphous silicon patterns 25b may be on the amorphous silicon pattern 25a.

The source electrode 27 is electrically connected with one n⁺ amorphous silicon patterns 25b. The source electrode 27 extends along the substrate 10 from a data line 28 extending in the second direction of FIG. 1. In an embodiment, the data line 28 including the source electrode 27 is formed of Al or an Al alloy. In an embodiment, the source electrode 27 may have a rectangular shape or a horseshoe shape. The drain electrode 29 may be electrically connected with the other of the n⁺ amorphous silicon patterns 25b of the channel layer 25. The drain electrode 29 may be in a direction substantially parallel to the source electrode 27.

Referring to FIGS. 1 and 2, a storage capacitor structure 24 is further disposed on the substrate 10. The storage capacitor structure 24 includes the gate line 22, the gate insulating layer 23, and a storage capacitor electrode 24a covering the gate line 22.

The first stress absorbing layer 30 may be below the thin film transistor. The first stress absorbing layer 30 may be interposed between the substrate 10 and the gate insulating layer 23. In an embodiment, the first stress absorbing layer 30 may be an organic layer. Examples of a material that may be used for the first stress absorbing layer 30 include an overcoat-material and polyimide. The first stress absorbing layer 30 may absorb excessive stress applied to the gate electrode 21 and/or the gate insulating layer 23 of the TFT 20 as the substrate 10 is warped to prevent the gate electrode 21 and/or the gate insulating layer 23 from being damaged.

The second stress absorbing layer 40 may be on the thin film transistor. The second stress absorbing layer 40 may cover the TFT 20 formed on the substrate 10. The second stress absorbing layer 40 may be an organic layer. Examples of a material that may be used for the second stress absorbing layer 40 include photo acryl and benzo cyclo butene (BCB). The second stress absorbing layer 40 may absorb excessive stress applied to the source electrode 27, the drain electrode 29 of the TFT 20, and a pixel electrode 50, which will be described below, as the substrate 10 is warped to prevent the source electrode 27, the drain electrode 29, and the pixel electrode 50 from being damaged.

Referring to FIG. 1, the second stress absorbing layer 40 may include a first contact hole 29a and a second contact hole 29b. The first contact hole 29a exposes the drain electrode 29, and the second contact hole 29b exposes the storage capacitor electrode 24a of the storage capacitor structure 24.

The pixel electrode 50 is disposed in a pixel region defined by gate lines 22 and data lines 28. A portion of the pixel electrode 50 is electrically connected with the drain electrode 29 exposed via the first contact hole 29a. Also, a portion of the pixel electrode 50 is electrically connected with the storage capacitor electrode 24a exposed via the second contact hole 29b.

Examples of a material that may be used for the pixel electrode 50 include transparent and conductive indium-tin-oxide (ITO), indium-zinc-oxide (IZO), or amorphous ITO(a-ITO). Alternatively, the pixel electrode 50 may include metal of high light reflectively, such as Al or an Al alloy.

Figure 3:
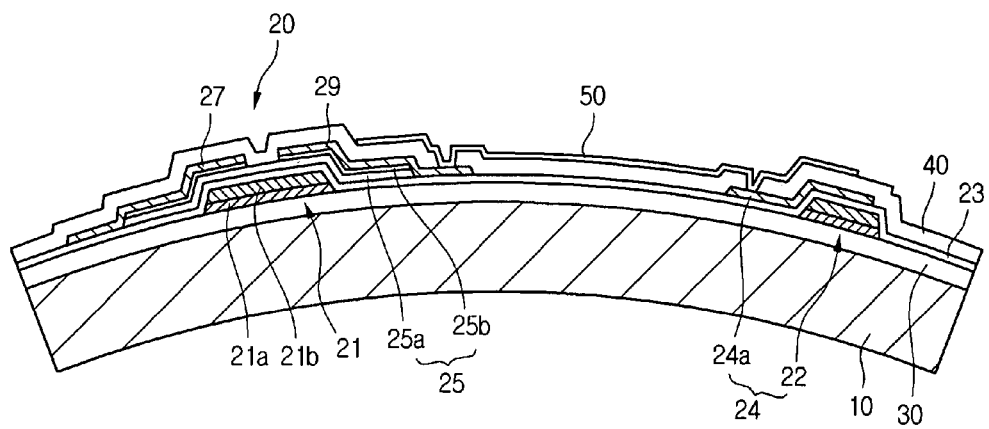
FIG. 3 is a cross-sectional view of when the substrate of FIG. 2 is warped.

FIG. 3 is a cross-sectional view of when the substrate of FIG. 2 is warped.

Referring to FIG. 3, excessive stress is applied to the gate electrode 21, the gate insulating layer 23, the channel layer 25, the source electrode 27, the drain electrode 29 of the TFT 20, and the pixel electrode 50 when the substrate 10 is warped. Consequently, the gate electrode 21, the gate insulating layer 23, the channel layer 25, the source electrode 27, the drain electrode 29, and the pixel electrode 50 may be damaged.

However, when the first stress absorbing layer 30 and the second stress absorbing layer 40 are formed, a portion and/or all of the excessive stress applied to the gate electrode 21, the gate insulating layer 23, the channel layer 25, the source electrode 27, the drain electrode 29, and the pixel electrode 50 is absorbed by the first stress absorbing layer 30 and/or the second stress absorbing layer 40 to prevent the gate electrode 21, the gate insulating layer 23, the channel layer 25, the source electrode 27, the drain electrode 29, and the pixel electrode 50 from being damaged.

Particularly, damage of the gate electrode 21, the gate insulating layer 23, the channel layer 25, the source electrode 27, the drain electrode 29 forming the TFT 20, and the pixel electrode 50 may be considerably reduced by disposing the first and second stress absorbing layers 30 and 40 on and under the TFT 20.

Figure 4:
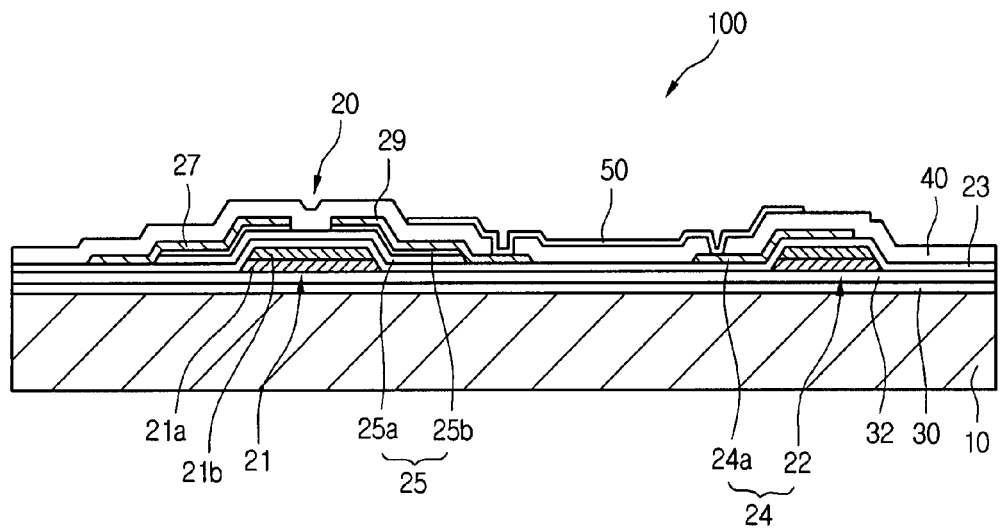
FIG. 4 is a cross-sectional view of a display substrate according to another embodiment.

FIG. 4 is a cross-sectional view of a display substrate according to other embodiments. The display substrate is similar to the display substrate according to the previous embodiments. Therefore, same reference numerals and same names are used for the same elements as those of the previous embodiments.

Referring to FIG. 4, a display device 100 includes a substrate 10, a thin film transistor (TFT) 20, a first stress absorbing layer 30, a second stress absorbing layer 40, and a pixel electrode 50.

In FIG. 4, a first protection layer 32 is formed on the first stress absorbing layer 30. In an embodiment, the first stress absorbing layer 30 may include an organic layer and the first protection layer 32 may include an inorganic layer.

The organic layer of the first stress absorbing layer 30 may include an overcoat or polyimide, and the inorganic layer of the first protection layer 32 may include an oxide layer or a nitride layer.

The first stress absorbing layer 30 may absorb excessive stress applied to the TFT 20 to prevent the TFT 20 from being damaged. In an embodiment, the first protection layer 32 may prevent a volatilizing solvent from an organic layer of the first stress absorbing layer 30 from flowing into an interior portion of a display device, for example, a liquid crystal layer (not shown) of a liquid crystal display device.

Figure 5:
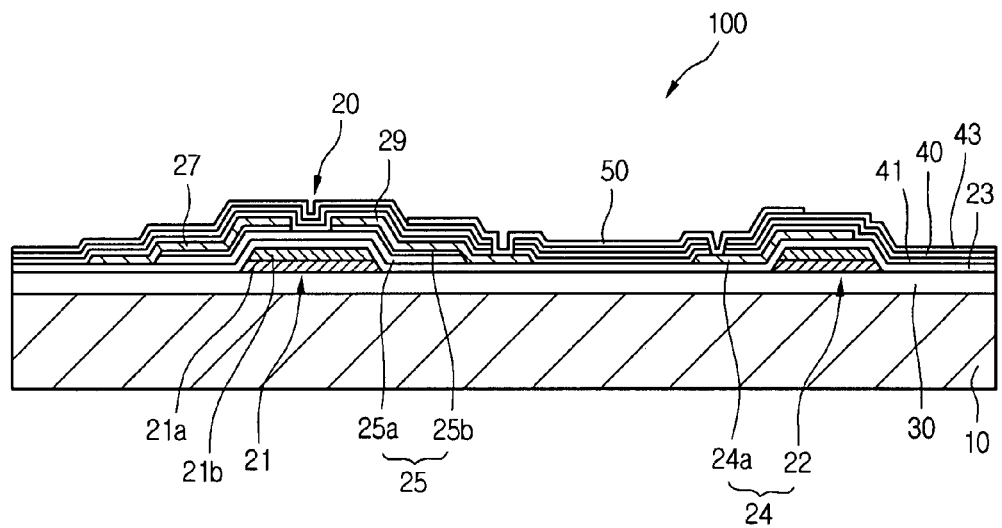
FIG. 5 is a cross-sectional view of a display substrate according to still another embodiment.

FIG. 5 is a cross-sectional view of a display substrate according to still other embodiments. The display substrate is similar to the display substrate according to previous embodiments. Therefore, same reference numerals and same names are used for the same elements as those of the previous embodiment.

Referring to FIG. 5, a display device 100 includes a substrate 10, a thin film transistor (TFT) 20, a first stress absorbing layer 30, a second stress absorbing layer 40, and a pixel electrode 50.

In an embodiment, a second protection layer 43 may formed on the second stress absorbing layer 40. The second stress absorbing layer 40 may include an organic layer. The second protection layer 43 may include an inorganic layer.

In another embodiment, a third protection layer 41 may be formed between the second stress absorbing layer 40 and the TFT. In still another embodiment, a second protection layer 43 may formed on the second stress absorbing layer 40 and a third protection layer 41 may be formed between the second stress absorbing layer 40 and the TFT. The third protection layer 41 may include an inorganic layer.

In FIG. 5, the third protection layer 41 contacts an amorphous silicon pattern 25a of a channel layer 25 exposed between a source electrode 27 and a drain electrode 29. The second stress absorbing layer 40 is disposed on the third protection layer 41, and the second protection layer 43 is disposed on the second stress absorbing layer 40.

In an embodiment, the second and third protection layers 43 and 41 may include an oxide layer or a nitride layer. The second stress absorbing layer 40 may include photo acryl or BCB.

The third protection layer 41 may prevent an organic layer of the second stress absorbing layer 40 from directly contacting an exposed portion of the channel layer 25. The second protection layer 43 may absorb excessive stress applied to the TFT 20 as the substrate 10 is warped to prevent the TFT 20 from being damaged.

Also, the second protection layer 43 may prevent a volatilizing solvent from an organic layer of the second stress absorbing layer 40 from flowing into an interior portion of a display device, for example, a liquid crystal layer (not shown) of a liquid crystal display device.

Figure 6:
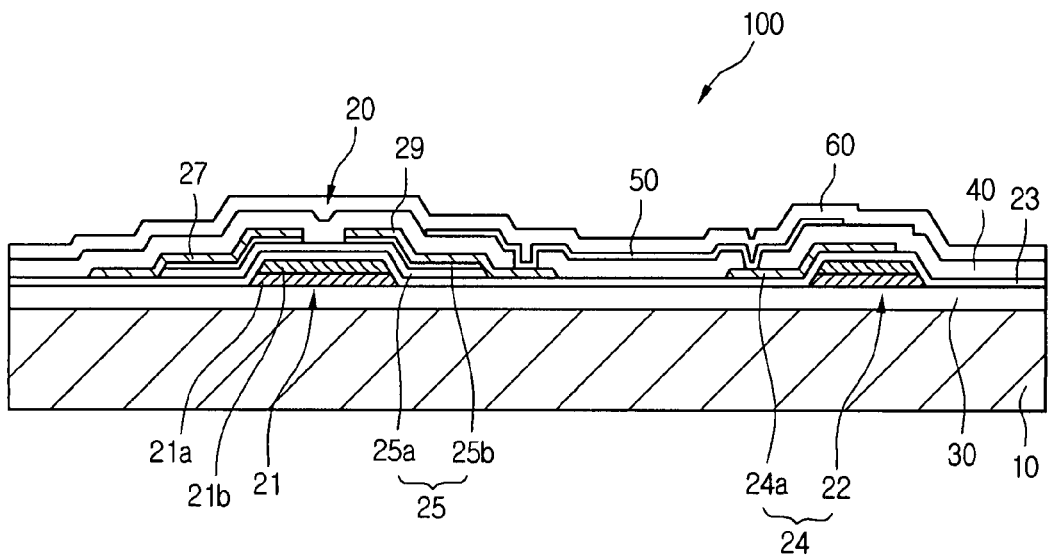
FIG. 6 is a cross-sectional view of a display substrate according to still another embodiment.

FIG. 6 is a cross-sectional view of a display substrate according to still other embodiments. The display substrate is substantially similar to the display substrate according to the previous embodiments. Therefore, the same reference numerals and same names are used for the same elements as those of the previous embodiments.

Referring to FIG. 6, a display substrate 100 includes a substrate 10, a thin film transistor (TFT) 20, a first stress absorbing layer 30, a second stress absorbing layer 40, a third stress absorbing layer 60, and a pixel electrode 50.

A third stress absorbing layer 60 is on the pixel electrode 50. The third stress absorbing layer 60 may cover the pixel electrode 50. In an embodiment, the third stress absorbing layer 60 includes an organic layer. Examples of a material that may be used for the third stress absorbing layer 60 include polyimide, an overcoat, photo acryl, and BCB.

In an embodiment, the first stress absorbing layer 60 covers the pixel electrode 50. The first stress absorbing layer 60 may absorb excessive stress applied to the pixel electrode 50 of the TFT 20 disposed under the third stress absorbing layer 60 as the substrate 10 is warped, thereby preventing the TFT 20 from being damaged.

Figure 13:
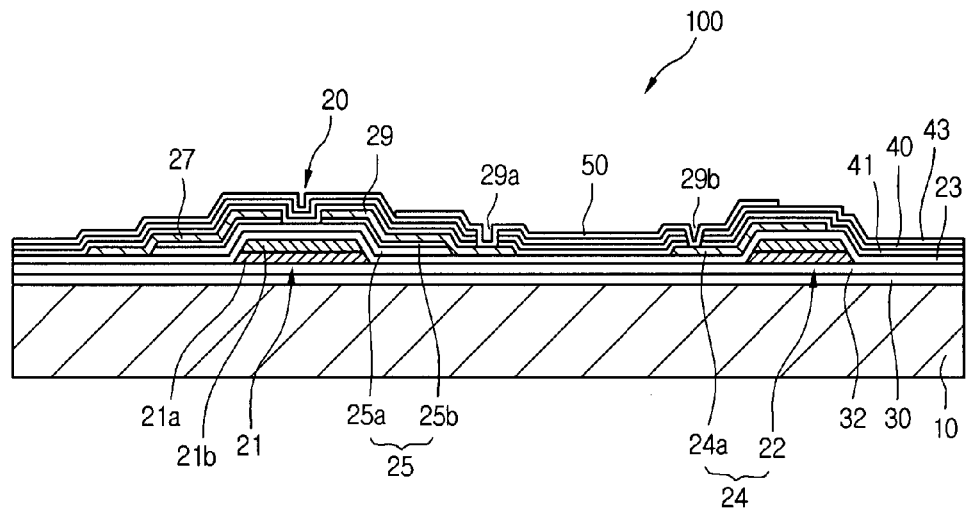
FIG. 13 is a cross-sectional view of a display substrate according to still another embodiment.

FIG. 13 is a cross-sectional view of a display substrate according to still other embodiments. The display substrate is substantially similar to the display substrate according to the previous embodiments. Therefore, the same reference numerals and same names are used for the same elements as those of the previous embodiment.

Referring to FIG. 13, a display substrate 100 includes a substrate 10, a thin film transistor (TFT) 20, a first stress absorbing layer 30, a second stress absorbing layer 40, and a pixel electrode 50.

In FIG. 13, a first protection layer 32 is formed on the first stress absorbing layer 30. A second protection layer 43 is formed on the second stress absorbing layer 40 and a third protection layer 41 is formed between the second stress absorbing layer 40 and the TFT. In an embodiment, a third stress absorbing layer 60 may be on the pixel electrode 50.

FIGS. 7 to 12 are cross-sectional views illustrating a method of manufacturing a display substrate according to still another embodiment.

Figure 7:
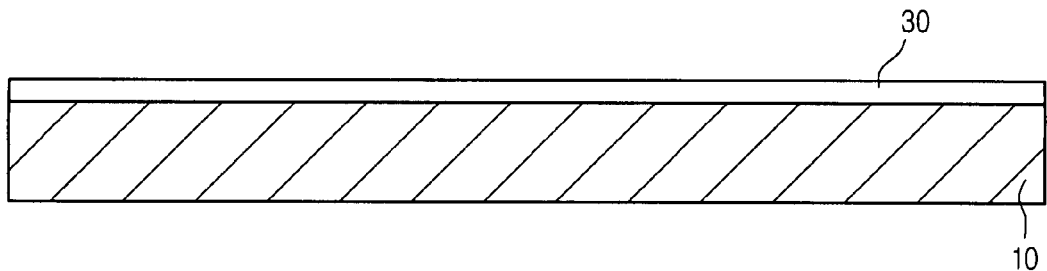
FIG. 7 is a cross-sectional view illustrating a method of manufacturing a display substrate according to still another embodiment.

Referring to FIG. 7, a first stress absorbing layer 30 is formed on a substrate 10. In an embodiment, the substrate 10 may be a transparent and flexible synthetic resin substrate. Examples of a material that may be used for the substrate 10 include polycarbonate (PC), polyimide (PI), polyethersulphone (PES), polyacrylate (PAR), polyethylenenaphthelate (PEN), and polyethyleneterephehalate (PET). Alternatively, the substrate 10 may be a foil having a very thin thickness.

The first stress absorbing layer 30 may be formed by coating an organic material dissolved in a solvent on the substrate 10 to form an organic layer, and volatilizing a solvent included in the organic layer.

Examples of a material that may be used for the organic layer for forming the first stress absorbing layer 30 to include an overcoat and PI. The organic layer for forming the first stress absorbing layer 30 may be formed through a spin coating process or a slit coating process.

After the organic layer is formed on the substrate 10, the first stress absorbing layer 30 may be formed by removing a solvent included in the organic layer through a bake process.

Figure 8:
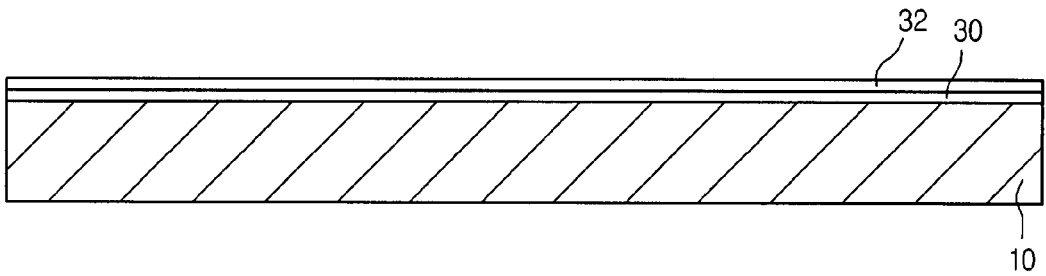
FIG. 8 is a cross-sectional view illustrating a method of manufacturing a display substrate according to still another embodiment.

Referring to FIG. 8, a first protection layer 32 may be formed on the first stress absorbing layer 30. In an embodiment, the first protection layer may include an organic layer and the first protection layer 32 may include an inorganic layer. In an embodiment, the organic layer may include an overcoat or PI, and the inorganic layer may include an oxide layer or a nitride layer.

To form the first stress absorbing layer 30 and the first protection layer 32, including the organic layer and the inorganic layer, the organic layer is formed on the substrate 10, and the inorganic layer is formed on the organic layer. At this point, a solvent included in the organic layer may be removed before the inorganic layer is formed on the organic layer.

In an embodiment, the first stress absorbing layer 30 absorbs a portion or all of excess stress applied to a TFT 20, which will be described later, to prevent the TFT 20 from being damaged.

Figure 9:
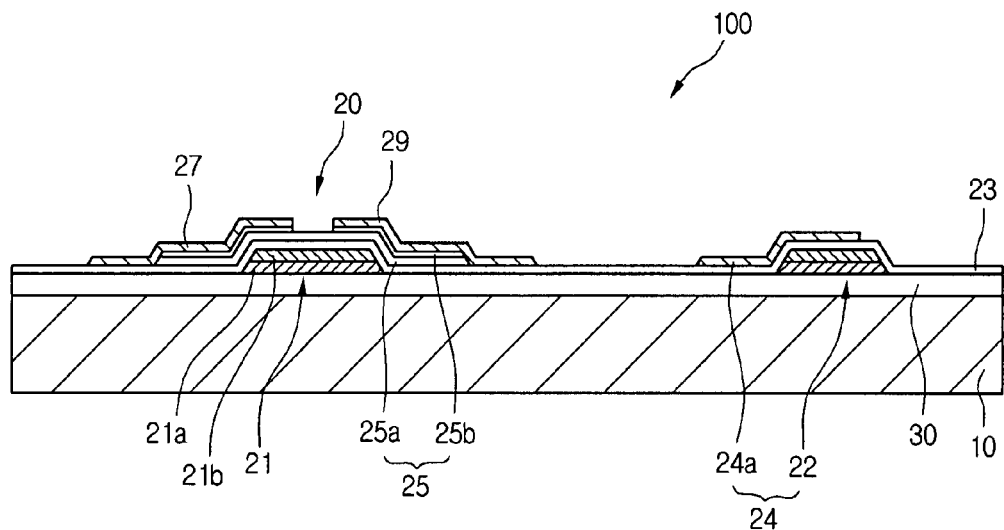
FIG. 9 is a cross-sectional view illustrating a method of manufacturing a display substrate according to still another embodiment.

Referring to FIG. 9, the first stress absorbing layer 30 is formed on the substrate 10, the TFT 20 is formed on the first stress absorbing layer 30.

To form the TFT 20 in an embodiment, a gate metal layer (not shown) may be formed on the first stress absorbing layer 30. The gate metal layer may include an Al—Nd alloy layer (not shown) and a Mo layer (not shown) disposed on the Al—Nd alloy layer. The gate metal layer may be formed on the first stress absorbing layer 30 through chemical vapor deposition (CVD) or sputtering.

To form the TFT 20 in another embodiment, a gate metal layer (not shown) may be formed on the first protection layer 32. The gate metal layer may include an Al—Nd alloy layer (not shown) and a Mo layer (not shown) disposed on the Al—Nd alloy layer. The gate metal layer may be formed on the first protection layer 32 through chemical vapor deposition (CVD) or sputtering. In an embodiment, an inorganic layer of the first protection layer 32 protects an organic layer of the first stress absorbing layer 30 from damage during the forming of the gate metal layer.

After the gate metal layer is formed, the gate metal layer may be patterned using a photolithography process to form a gate electrode 21 including an Al—Nd alloy pattern 21a and a Mo pattern 21b, and a gate line including a gate electrode 21 on the first stress absorbing layer 30 or the first protection layer 32.

After the gate line including the gate electrode 21 is formed, a gate insulating layer 23 is formed on the entire surface of the substrate, so that the gate line including the gate electrode 21 is covered with the gate insulating layer 23. In this embodiment, the gate insulating layer 23 may be an inorganic layer such as an oxide layer and a nitride layer. Also, the gate insulating layer 23 may be formed using CVD.

After the gate insulating layer 23 is formed, an amorphous silicon layer (not shown) and an $n^+$ amorphous silicon layer (not shown) into which high concentration impurities have been implanted are sequentially formed on the entire surface of the gate insulating layer 23.

Subsequently, the amorphous silicon layer and the $n^+$ amorphous silicon layer are patterned using a photolithography process to form a channel layer 25 including an amorphous silicon pattern 25a and an n+ amorphous silicon pattern 25b on the gate insulating layer 23.

Subsequently, a source/drain metal layer covering the channel layer 25 is formed on the gate insulating layer 23. After the source/drain metal layer is formed, the source/drain metal layer may be patterned by the photolithography process to form a source electrode 27 electrically connected with the channel layer 25, a data line including a data electrode, and a drain electrode 29 electrically connected with the channel layer 25 and separated from the source electrode 27 on the gate insulating layer 23.

Meanwhile, when the source/drain metal layer is patterned to form the source electrode 27 and the drain electrode 29, a storage capacitor electrode 24a covering a portion of the gate line on the gate insulating layer 23 may be formed.

Figure 10:
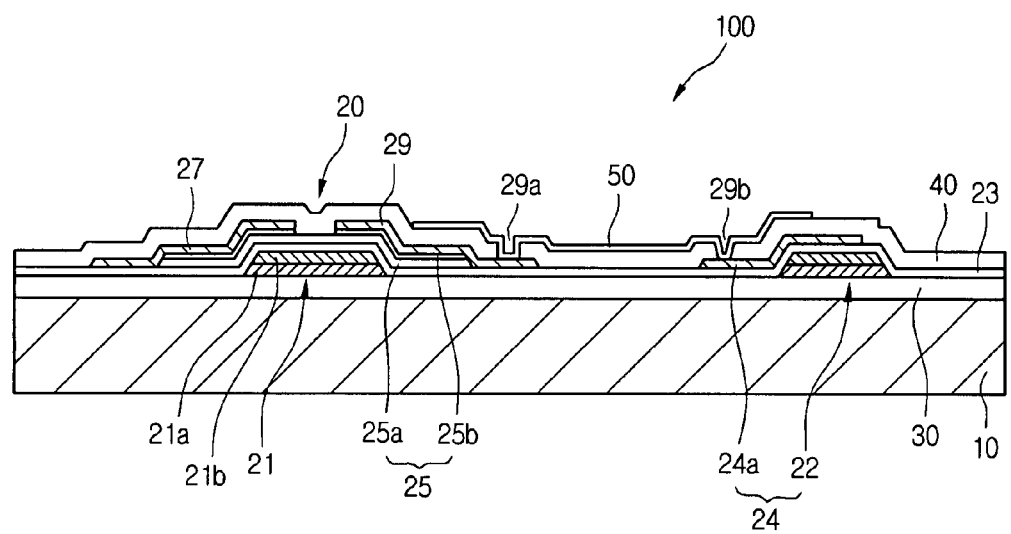
FIG. 10 is a cross-sectional view illustrating a method of manufacturing a display substrate according to still another embodiment.

Referring to FIG. 10, after the source electrode 27 and the drain electrode 29 are formed, a second stress absorbing layer 40 may be formed on the entire surface of the gate insulating layer 23. The second stress absorbing layer 40 may be formed using a spin coating process or a slit coating process. Examples of a material that may used for the second stress absorbing layer 40 include photo acryl and BCB.

The second stress absorbing layer 40 absorbs a portion or all of excessive stress applied to the TFT 20 formed on the first stress absorbing layer 30 to prevent the TFT 20 from being damaged.

After the second stress absorbing layer 40 is formed, the second stress absorbing layer 40 may be patterned through the photolithography process to form a first contact hole 29a and a second contact hole 29b in the second stress absorbing layer 40.

The first contact hole 29a exposes a portion of the drain electrode 29, and the second contact hole 29b exposes the storage capacitor electrode 24a of a storage capacitor structure 24. Subsequently, a transparent conductive electrode layer (not shown) is formed on the entire surface of the second stress absorbing layer 40. In this embodiment, the transparent electrode may be formed using a sputtering process or a CVD process. Examples of a material that may used for the transparent electrode include ITO, IZO, and amorphous ITO.

After the transparent electrode is formed, the transparent electrode may be patterned using the photolithography process to form a pixel electrode 50 on the second stress absorbing layer 40. A portion of the pixel electrode 50 is electrically connected with the drain electrode 29 via the first contact hole 29a, and a portion of the pixel electrode 50 is electrically connected with the storage capacitor electrode 24a via the second contact hole 24b.

Figure 11:
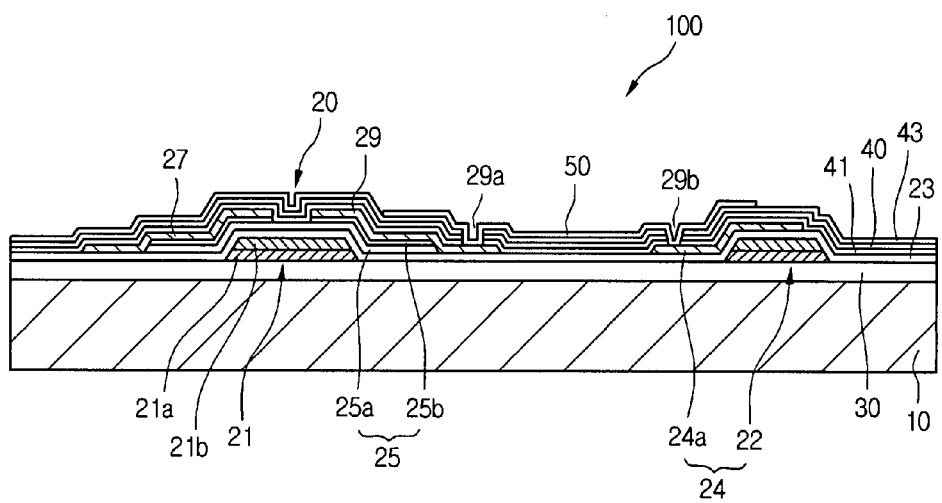
FIG. 11 is a cross-sectional view illustrating a method of manufacturing a display substrate according to still another embodiment.

FIG. 11 is a cross-sectional view illustrating a method of manufacturing a display substrate according to still another embodiment. The display substrate is substantially similar to the display device of the previous embodiment. Therefore, same reference numerals and same names are used for the same elements.

Referring to FIG. 11, the display substrate may include a second protection layer 43 and a third protection layer 41.

After a source electrode 27, a drain electrode 29 are formed, the third protection layer 41 is first formed. The second stress absorbing layer 40 is formed on the third protection layer 41, and the second protection layer 43 is formed on the second stress absorbing layer 40.

In this embodiment, the third protection layer 41 is formed on a channel layer 25 to prevent interface characteristic reduction that may be generated by direct contact between an organic layer of the second stress absorbing layer 40 and the channel layer 25. The second stress absorbing layer 40 absorbs a portion or all of excess stress applied to a TFT 20 to prevent the TFT 20 from being destroyed. The second protection layer 43 may prevent a gas such as a solvent from flowing from the organic layer into the display device. The second protection layer 43 may prevent damage to the second stress absorbing layer 40 during the forming of the pixel electrode 50.

Figure 12:
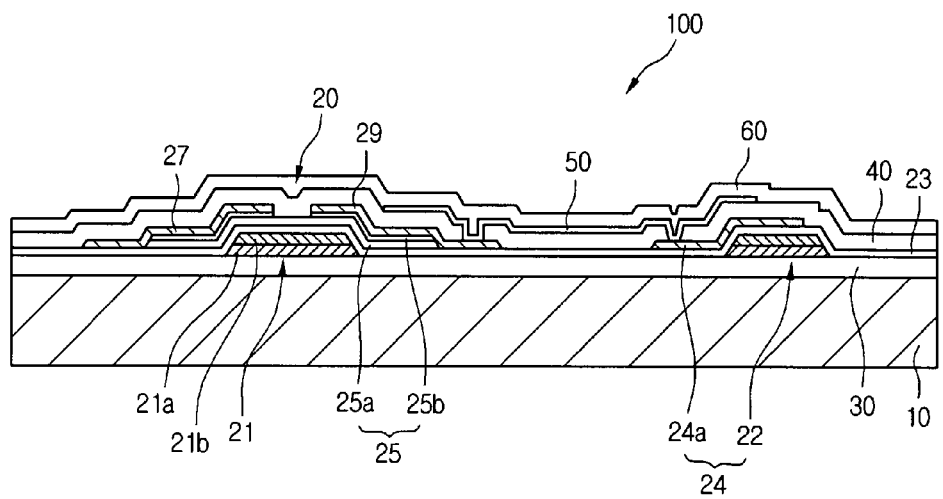
FIG. 12 is a cross-sectional view illustrating a method of manufacturing a display substrate according to still another embodiment.

FIG. 12 is a cross-sectional view illustrating a method of manufacturing a display device according to still another embodiments. The display device is substantially similar to the display substrate of the previous embodiments. Therefore, same reference numerals and same names are used for the same elements.

Referring to FIG. 12, after a pixel electrode 50 is formed, a third stress absorbing layer 60 may be formed on a substrate 10 to cover the pixel electrode 50. Examples of a material that may be used for the third stress absorbing layer 60 include photo acryl and BCB. The third stress absorbing layer 60 absorbs a portion or all of excessive stress applied to the pixel electrode 50 formed of an inorganic material to prevent the pixel electrode 50 from being destroyed.

As described in the embodiments above, the stress absorbing layers prevent the display substrate from being destroyed by excessive stress.

Figure 14:
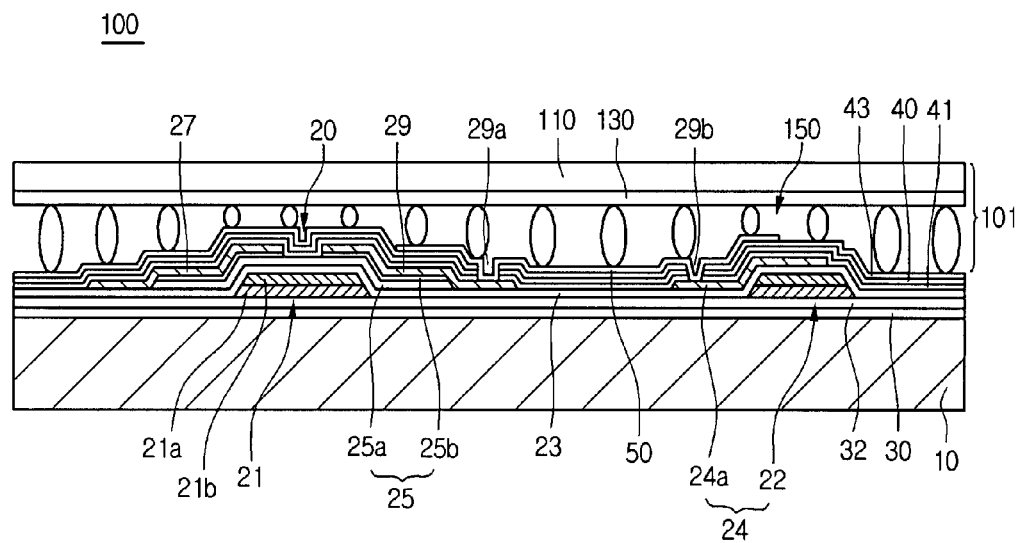
FIG. 14 is a cross-sectional view of a display device according to an embodiment.

FIG. 14 illustrates an electrophoretic ink flexible display device according to an embodiment.

Referring to FIG. 14, the display device includes a display substrate 100 and an electrophoretic ink film 101.

The illustrated embodiment includes a substrate 10, a thin film transistor (TFT) 20, a first protection layer 32 is formed on the first stress absorbing layer 30. A second protection layer 43 is formed on the second stress absorbing layer 40 and a third protection layer 41 is formed between the second stress absorbing layer 40 and the TFT.

The electrophoretic ink film 101 may be an E-INK film. The electrophoretic ink film may include a protection layer 110, a common electrode 130 and a microcapsule layer 150. The electrophoretic ink film may be formed on the substrate 10 by laminating.

Figure 15:
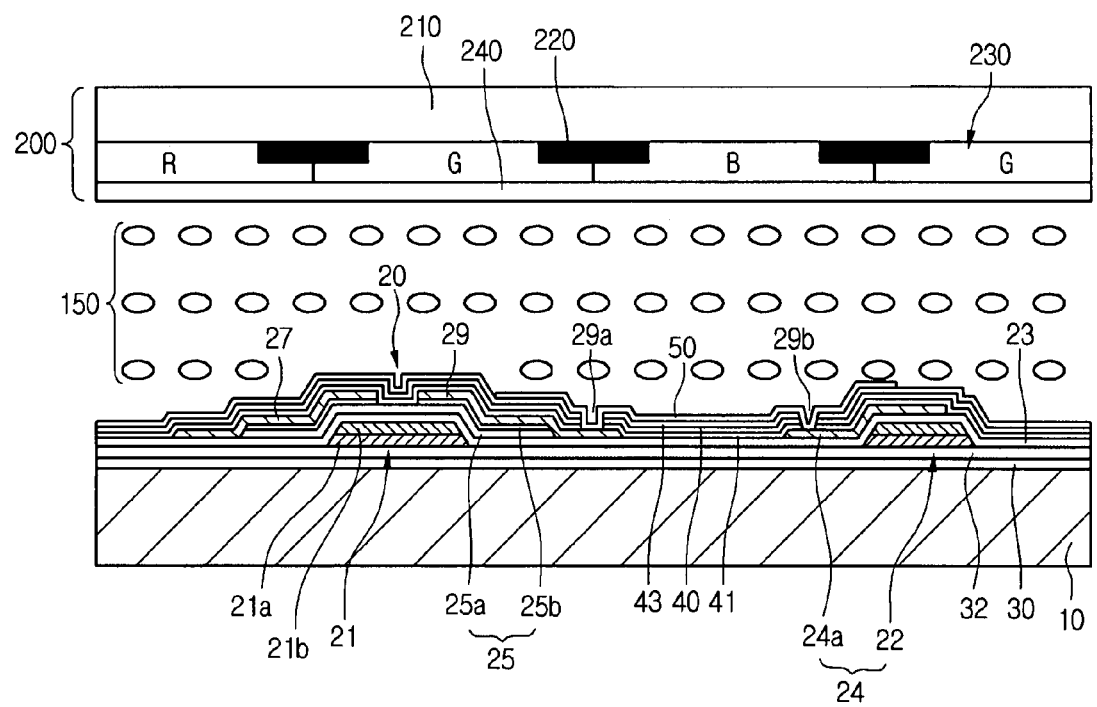
FIG. 15 is a cross-sectional view of a display device according to an embodiment.

FIG. 15 illustrates a liquid crystal flexible display device according to an embodiment.

Referring to FIG. 15, the display device includes a first flexible substrate 201, a second flexible substrate 200 and a liquid crystal layer 210 between the first flexible substrate 100 and the second flexible substrate 200.

The illustrated first flexible substrate 201 includes a first substrate 10, a thin film transistor (TFT) 20, a first protection layer 32 is formed on the first stress absorbing layer 30. A second protection layer 43 is formed on the second stress absorbing layer 40 and a third protection layer 41 is formed between the second stress absorbing layer 40 and the TFT.

The second flexible substrate 200 may include a second substrate 210, a black matrix 220, a color filter layer 230 on the black matrix 220, an overcoat layer 240 on the color filter layer 230. Also, a liquid crystal layer 250 is disposed in between the first flexible substrate 201 and the second flexible substrate 200. A common electrode may be included in the first flexible substrate 201 (Twist Nematic mode) or the second flexible substrate 200 (In-Plane Switching mode).

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A flexible display substrate comprising:
   a thin film transistor on the flexible substrate, the thin film transistor including a gate electrode extending from a gate line, a gate insulating layer insulating the gate electrode, a channel layer on the gate insulating layer, a source electrode connected with the channel layer, and a drain electrode connected with the channel layer;
   a storage capacitor on the flexible substrate, the storage capacitor including the gate line, the gate insulating layer and a storage capacitor electrode covering the gate line;
   a first stress absorbing layer below the thin film transistor and the storage capacitor;
   a first protection layer on the first stress absorbing layer;
   a second stress absorbing layer on the thin film transistor and the storage capacitor;
   a second protection layer on the second stress absorbing layer;
   a third stress absorbing layer on the pixel electrode;

a pixel electrode on the second protection layer, the pixel electrode being connected with the drain electrode via a first contact hole in the second stress absorbing layer and the second protection layer and with the storage capacitor electrode via a second contact hole in the second stress absorbing and the second protection layer; and a third protection layer between the second stress absorbing layer and the thin film transistor.

2. The flexible display substrate of claim 1,
wherein the first stress absorbing layer includes an organic layer;
wherein the first protection layer includes an inorganic layer;
wherein the second stress absorbing layer includes an organic layer;
wherein the second protection layer includes an inorganic layer; and
wherein the third protection layer includes an inorganic layer.

3. The flexible display substrate of claim 1, wherein the third stress absorbing layer includes an organic layer.

4. A method of manufacturing a flexible display substrate comprising:
forming a first stress absorbing layer on the flexible substrate;
forming a first protection layer on the first stress absorbing layer;
forming a thin film transistor on the first protection layer, the thin film transistor including a gate electrode extending from a gate line, a gate insulating layer insulating the gate electrode, a channel layer on the gate insulating layer, a source electrode connected with the channel layer, and a drain electrode connected with the channel layer;
forming a storage capacitor on the flexible substrate, the storage capacitor including the gate line, the gate insulating layer and a storage capacitor electrode covering the gate line;
forming a second stress absorbing layer on the thin film transistor and the storage capacitor;
forming a second protection layer on the second stress absorbing layer;
forming a pixel electrode on the second protection layer, the pixel electrode being connected with the drain electrode via a first contact hole in the second stress absorbing layer and the second protection layer and with the storage capacitor electrode via a second contact hole in the second stress absorbing and the second protection layer; and
a third protection layer below the second stress absorbing layer and on the thin film transistor and the storage capacitor.

5. The method of claim 4,
wherein the first stress absorbing layer includes an organic layer;
wherein the first protection layer includes an inorganic layer;
wherein the second stress absorbing layer includes an organic layer;
wherein the second protection layer includes an inorganic layer; and
wherein the third protection layer includes an inorganic layer.

6. The flexible display substrate of claim 4, further comprising a third stress absorbing layer on the pixel electrode.

7. The flexible display substrate of claim 6 wherein the third stress absorbing layer includes an organic layer.

8. A method of manufacturing an electrophoretic ink flexible display device comprising:
forming a first stress absorbing layer on a flexible substrate;
forming a first protection layer on the first stress absorbing layer;
forming a thin film transistor on the first protection layer, the thin film transistor including a gate electrode extending from a gate line, a gate insulating layer insulating the gate electrode, a channel layer on the gate insulating layer, a source electrode connected with the channel layer, and a drain electrode connected with the channel layer;
forming a storage capacitor on the flexible substrate, the storage capacitor including the gate line, the gate insulating layer and a storage capacitor electrode covering the gate line;
forming a second stress absorbing layer on the thin film transistor and the storage capacitor;
forming a second protection layer on the second stress absorbing layer;
forming a pixel electrode on the second protection layer, the pixel electrode being connected with the drain electrode via a first contact hole in the second stress absorbing layer and the second protection layer and with the storage capacitor electrode via a second contact hole in the second stress absorbing and the second protection layer;
forming an electrophoretic ink film on the flexible substrate; and
a third protection layer below the second stress absorbing layer and on the thin film transistor and the storage capacitor.

9. The method of claim 8,
wherein the first stress absorbing layer includes an organic layer;
wherein the first protection layer includes an inorganic layer;
wherein the second stress absorbing layer includes an organic layer;
wherein the second protection layer includes an inorganic layer; and
wherein the third protection layer includes an inorganic layer.

10. A method of manufacturing a flexible liquid crystal display device comprising:
forming a first stress absorbing layer on a first flexible substrate;
forming a first protection layer on the first stress absorbing layer;
forming a thin film transistor on the first protection layer, the thin film transistor including a gate electrode extending from a gate line, a gate insulating layer insulating the gate electrode, a channel layer on the gate insulating layer, a source electrode connected with the channel layer, and a drain electrode connected with the channel layer;
forming a storage capacitor on the flexible substrate, the storage capacitor including the gate line, the gate insulating layer and a storage capacitor electrode covering the gate line;
forming a second stress absorbing layer on the thin film transistor;
forming a second protection layer on the second stress absorbing layer;
forming a pixel electrode on the second protection layer, the pixel electrode being connected with the drain electrode via a first contact hole in the second stress absorbing layer and the second protection layer and with the storage capacitor electrode via a second contact hole in the second stress absorbing and the second protection layer;

forming a second flexible substrate;

forming a liquid crystal layer between the first and second flexible substrates, and a third protection layer below the second stress absorbing layer and on the thin film transistor and the storage capacitor.

11. The method of claim 10, further comprising:
forming a black matrix on the second flexible substrate;
forming a color filter layer on the black matrix;
forming an overcoat layer on the color filter layer; and
forming a common electrode on the overcoat layer.

12. The method of claim 10,
wherein the first stress absorbing layer includes an organic layer;
wherein the first protection layer includes an inorganic layer;
wherein the second stress absorbing layer includes an organic layer;
wherein the second protection layer includes an inorganic layer; and
wherein the third protection layer includes an inorganic layer.

13. A flexible display substrate, comprising:
a thin film transistor on the flexible substrate, the thin film transistor including a gate electrode extending from a gate line, a gate insulating layer insulating the gate electrode, a channel layer on the gate insulating layer, a source electrode connected with the channel layer, and a drain electrode connected with the channel layer;

a storage capacitor on the flexible substrate, the storage capacitor including the gate line, the gate insulating layer and a storage capacitor electrode covering the gate line;

a first stress absorbing layer below the thin film transistor and the storage capacitor;

a first protection layer on the first stress absorbing layer;

a second stress absorbing layer on the thin film transistor and the storage capacitor;

a second protection layer on the second stress absorbing layer; and a pixel electrode on the second protection layer, the pixel electrode being connected with the drain electrode via a first contact hole in the second stress absorbing layer and the second protection layer and with the storage capacitor electrode via a second contact hole in the second stress absorbing and the second protection layer; and a third protection layer below the second stress absorbing layer and on the thin film transistor and the storage capacitor.

14. The flexible display substrate of claim 13, wherein the third protection layer contacts an amorphous silicon pattern of the channel layer exposed between the source electrode and the drain electrode.

* * * * *